(12) United States Patent
Josefsson (10) Patent No.: US 7,920,022 B2
(45) Date of Patent: Apr. 5, 2011

(54) SWITCHED CAPACITOR SYSTEM WITH AND METHOD FOR OUTPUT GLITCH REDUCTION

(75) Inventor: Olafur Mar Josefsson, North Reading, MA (US)

(73) Assignee: Analog Devices, Inc., Norwood, MA (US)

( * ) Notice: Subject to any disclaimer, the term of this patent is extended or adjusted under 35 U.S.C. 154(b) by 1523 days.

(21) Appl. No.: 11/172,263

(22) Filed: Jun. 30, 2005

(65) Prior Publication Data

US 2007/0001757 A1    Jan. 4, 2007

(51) Int. Cl.
*H03F 1/02*    (2006.01)
(52) U.S. Cl. .......................................... 330/9; 330/305
(58) Field of Classification Search ............... 330/260, 330/271, 285, 302, 305
See application file for complete search history.

(56) References Cited

U.S. PATENT DOCUMENTS

| 5,391,999 | A | 2/1995 | Early et al. |
| 5,495,200 | A | 2/1996 | Kwan et al. |
| 5,644,257 | A | 7/1997 | Kerth et al. |
| 6,118,399 | A | 9/2000 | Krone |
| 7,795,958 | B2 * | 9/2010 | Agarwal et al. ............... 330/9 |
| 7,795,959 | B2 * | 9/2010 | Chen et al. .................... 330/9 |
| 7,834,685 | B1 * | 11/2010 | Pertijs ............................ 330/9 |

OTHER PUBLICATIONS

Axel, Thomsen et al.: "A 110-dB-THD, 18-mW DAC Using Sampling of the Output and Feedback to Reduce Distortion", IEEE Journal of Solid-State Circuits, IEEE Service Center, Piscataway, NJ, US, vol. 34, No. 12, Dec. 1999.

* cited by examiner

*Primary Examiner* — Michael B Shingleton
(74) *Attorney, Agent, or Firm* — Bingham McCutchen LLP (57) ABSTRACT

A switched capacitor system with output glitch reduction step charges the switched capacitor by switching it to a first voltage level in a first phase, to an intermediate voltage level of a pre-charge node in a pre-charge phase and to the voltage level of the output node of the amplifier stage in a settling phase; the pre-charge node can be implemented at the input of the amplifier stage, the output of a preceding stage or at any other pre-existing suitable node in the amplifier system.

32 Claims, 9 Drawing Sheets

SWITCHED CAPACITOR SYSTEM WITH AND METHOD FOR OUTPUT GLITCH REDUCTION

FIELD OF THE INVENTION

This invention relates to a switched capacitor system with and method for output glitch reduction using pre-charging from a preexisting node.

BACKGROUND OF THE INVENTION

Switched capacitor circuitry often suffers from glitches when a capacitor which has one terminal connected to node N1 (sitting at voltage V1) is switched to node N2 (sitting at voltage V2 which is substantially different from V1). When this happens, node N2 may momentarily move tens or hundreds of millivolts away from V2 (towards V1) before settling again at V2. If node N2 is at the output of a DAC, for example, such glitches can translate into distortion or other undesired spectral artifacts. Minimizing such glitches in areas where they can not be tolerated usually calls for using extra power or silicon area. For example, in one approach a separate, additional buffer amplifier is used to charge the capacitor to a voltage which closely approximates the voltage on node N2 and then charging the capacitor the rest of the way to the N2 node voltage. While this does provide a solution it requires an additional buffer amplifier which increases the required chip area, power, and the cost. See e.g. U.S. Pat. No. 6,118,399.

BRIEF SUMMARY OF THE INVENTION

It is therefore an object of this invention to provide an improved switched capacitor system with and method for output glitch reduction.

It is a further object of this invention to provide such an improved switched capacitor system with and method for output glitch reduction which employs pre-charging from a preexisting node.

It is a further object of this invention to provide such an improved switched capacitor system with and method for output glitch reduction which requires less chip area and power.

It is a further object of this invention to provide such an improved switched capacitor system with and method for output glitch reduction which requires no additional buffer amplifiers or charging circuits.

It is a further object of this invention to provide such an improved switched capacitor system with and method for output glitch reduction which through cross-coupling can double the voltage and charge available to the switched capacitor and consequently allow the size of the switched capacitor to be reduced yet hold the same charge.

The invention results from the realization that glitch reduction in the output of a switched capacitor system can be achieved by charging a switched capacitor by switching it to a first voltage level in a first phase, to an intermediate voltage level of a pre-charge node in a pre-charge phase and to the output node of the amplifier stage in a settling phase, wherein the pre-charge node could be implemented at the input of the amplifier stage, the output of a preceding stage or at any other preexisting suitable node in the amplifier system.

The subject invention, however, in other embodiments, need not achieve all these objectives and the claims hereof should not be limited to structures or methods capable of achieving these objectives.

This invention features a switched capacitor system with output glitch reduction, including an amplifier stage having an input node and an output node and a switched capacitor. There is a switching circuit for charging the switched capacitor to a first voltage level in a first phase, to the intermediate voltage level of the input node in a pre-charge phase, and to the voltage level of the output node in the settling phase to reduce the output glitch of the amplifier stage.

In a preferred embodiment the amplifier stage may have a unity gain. There may be at least one preceding amplifier stage and the input node may be at the output of the preceding stage.

This invention also features a switched capacitor system with output glitch reduction including an amplifier system including an amplifier stage having an output node, a switched capacitor and a preexisting pre-charge node included in the amplifier system. A switching circuit charges the switched capacitor to a first voltage level in the first phase, to the intermediate voltage level of the pre-charge node in a pre-charge phase, and to the voltage level of the output node in a settling phase to reduce the output glitch of the amplifier stage.

In a preferred embodiment the amplifier stage may have a unity gain. The pre-charge node may be at the input of the amplifier stage; the pre-charge node may be at output of a preceding amplifier stage. The amplifier system may be multi-stage and the pre-charge node may be at the output of a preceding amplifier stage.

This invention also features a differential switched capacitor system with output glitch reduction including an amplifier stage having two input nodes and two output nodes and first and second channels. Each channel includes a switched capacitor and a switching circuit for charging the switched capacitor to a first voltage level in a first phase, to the intermediate voltage level of the input node in a pre-charge phase and to the voltage level of the output node in a settling phase to reduce the output glitch of the amplifier stage.

In a preferred embodiment the amplifier stage may have a unity gain. There may be at least one preceding amplifier stage and the input node may be at the output of the preceding stage. The switching circuit may include a cross-coupled circuit for cross-coupling the output nodes to the switched capacitors and cross-coupling the pre-charge nodes to the switched capacitors to increase the voltage across the switched capacitors.

The invention also features a differential switched capacitor system with output glitch reduction including an amplifier system including an amplifier stage having two output nodes and first and second channels. Each channel includes a switched capacitor and a preexisting pre-charge node included in the amplifier system. Each channel also includes a switching circuit for charging the switched capacitor to a first voltage level in a first phase, to the intermediate voltage level of the pre-charge node in a pre-charge phase and to the voltage level of the output node in a settling phase to reduce the output glitch of the amplifier stage.

In a preferred embodiment the amplifier stage may have a unity gain. The pre-charge node may be at the input of the amplifier stage. The amplifier system may be multi-stage and the pre-charge node may be at the output of a preceding amplifier stage. The switching circuits may include cross-coupled circuits for cross-coupling the output nodes to the switched capacitors and cross-coupling the pre-charge nodes to the switched capacitors to increase the voltage across the switched capacitors.

The invention also features a method of output glitch reduction in a switched capacitor system including an amplifier stage having an input node and an output node and a switched capacitor. The method includes charging the switched capacitor to a first voltage level in a first phase; charging the switched capacitor to the intermediate voltage level of the input node in a pre-charge phase; and charging the switched capacitor to the desired voltage level of the output node in a settling phase to reduce the output glitch of the amplifier stage.

In a preferred embodiment the amplifier stage may have a unity gain. There may be at least one preceding amplifier stage and the input node may be at the output of the preceding stage.

The invention also features a method of output glitch reduction in a switched capacitor system including an amplifier system with an amplifier stage having an output node, a switched capacitor, and a preexisting pre-charge node included in the amplifier system. The method includes charging the switched capacitor to a first voltage level in a first phase; charging the switched capacitor to the intermediate voltage level of the pre-charge node in the pre-charge phase; and charging the switched capacitor to the voltage level of the output node in a settling phase to reduce the output glitch of the amplifier stage.

In a preferred embodiment the amplifier stage may have a unity gain. The pre-charge node may be at the input of the amplifier stage. The amplifier system may be multi-stage and the pre-charge node may be at the output of a preceding amplifier stage.

The invention also features a method of output glitch reduction in a differential switched capacitor system including an amplifier stage having two input nodes and two output nodes, and first and second channels, each channel including a switched capacitor. The method includes step charging the switched capacitor to a first voltage level in a first phase; charging the switched capacitor to the intermediate voltage level of the input node in a pre-charge phase; and charging the switched capacitor to the voltage level of the output node in a settling phase to reduce the output glitch of the amplifier stage.

In a preferred embodiment the amplifier stage may have a unity gain. There may be at least one preceding amplifier stage and the input node may be at the output of the preceding stage. The switching circuits may include cross-coupled switched circuits for cross-coupling the output nodes to the switched capacitors and cross-coupling the pre-charge nodes to the switched capacitors to increase the voltage across the switched capacitors.

The invention also features a method of output glitch reduction in a differential switched capacitor system having an amplifier system with an amplifier stage having two output nodes, and first and second channels, each channel including a switched capacitor and a preexisting pre-charge node included in the amplifier system. The method includes charging the switched capacitor to a first voltage level in a first phase; charging the switched capacitor to the intermediate voltage level of the pre-charge node in the a pre-charge phase; and charging the switched capacitor to the voltage level of the output node in a settling phase to reduce the output glitch of the amplifier stage.

In a preferred embodiment the amplifier stage may have a unity gain. The pre-charge node may be at the input of the amplifier stage. The amplifier system may be multi-stage and the pre-charge node may be at the output of a preceding amplifier stage. The switching circuits may include cross-coupled switched circuits for cross-coupling the output nodes to the switched capacitors and cross-coupling the pre-charge nodes to the switched capacitors to increase the voltage across the switched capacitors.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
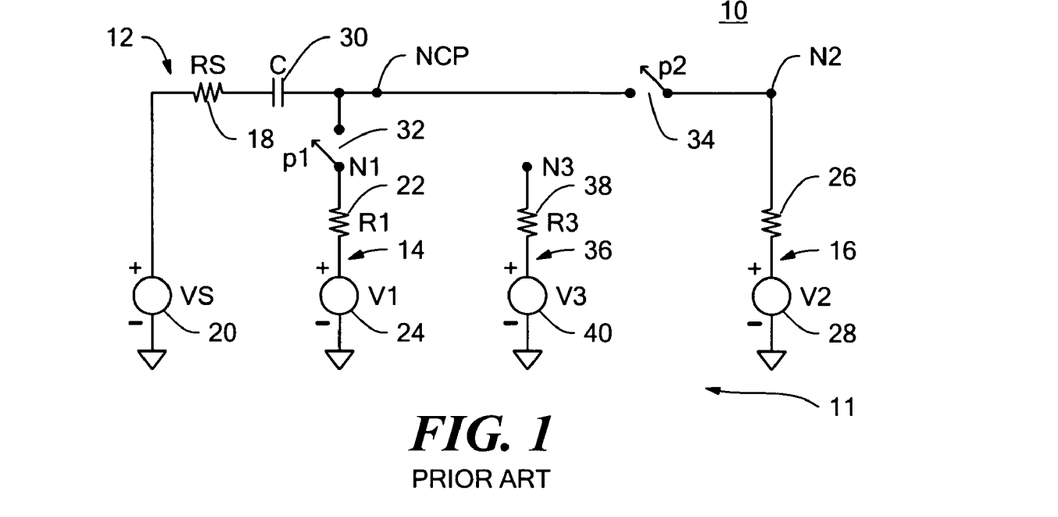
FIG. 1 is a schematic equivalent circuit of a prior art switched capacitor system without output glitch reduction.

There is shown in FIG. 1 the equivalent circuit schematic of a prior art switched capacitor system 10 without output glitch reduction. Switched capacitor system 10 includes a system 11 containing three voltage sources 12, 14, and 16 which may represent amplifiers or amplifier stages, for example. An amplifier is equivalently represented in each case by resistor 18 and ideal voltage source 20; resistor 22 and ideal voltage source 24; and resistor 26 and ideal voltage source 28, respectively. There is a capacitor 30, which may be a feedback capacitor, and two switches, switch 32 which is operated in phase P1 and switch 34 which is operated in phase P2. There is a third voltage source, e.g., amplifier 36 which may be represented by resistor 38 and ideal voltage source 40 which is deliberately shown as preexisting but not connected to the rest of the circuit.

Figure 2:
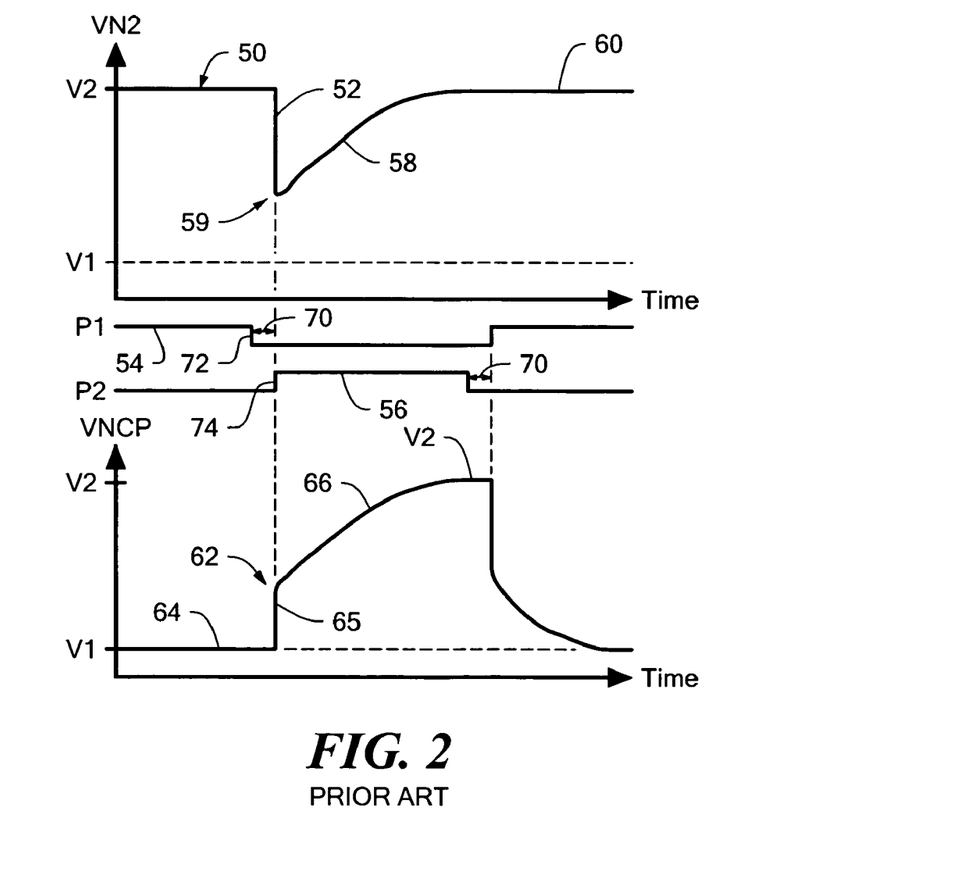
FIG. 2 shows waveforms occurring in the system of FIG. 1 illustrating an output glitch.

In operation, in phase P1, switch 32 is closed and switch 34 is open so that capacitor 30 charges to voltage V1. In phase P2, switch 32 is open and switch 34 is closed; prior to switch 34 closing node NCP is at V1 and node N2 is at voltage V2. As soon as switch 34 is closed in phase P2, the voltage in N2 will drop, typically hundreds of millivolts before it can recover to the desired voltage V2 (assuming V2>>V1). This is the so-called glitch that occurs in the output. This can be seen more clearly with respect to the waveforms, FIG. 2, where the output voltage in VN2 50 is shown constant at voltage V2 during phase P1 54 but then drops dramatically at 52 with the beginning 74 of phase P2. Voltage VN2 is the voltage on node N2 versus time. The drop 52 followed by the gradual rise 58 creates the profile 59 which is referred to commonly as the "glitch". Voltage VN2 then slowly recovers as shown at 58 back to the V2 level at 60. The voltage VNCP, 62, at node NCP is at voltage level V1, 64, until phase P2 starts when VNCP jumps abruptly at 65 and then increases 66 gradually to V2. Voltage VNCP is the voltage on node NCP versus time. The small gap 70 between the end of phase P1 and the beginning 74 of phase P2 is simply a non-overlap time so that the two switches will not be closed at the same time causing a momentary short. The time is very brief, on the order of nano-seconds. This non-overlap time gap is shown subsequently in FIGS. 5, 7, and 11 without further comment. One prior art approach to the reduction or elimination of the glitch is to make the resistance 26 as small as possible. However, reducing the value of the resistance calls for a greater silicon area or more power consumption, or both, which is unattractive in many applications.

Figure 3:
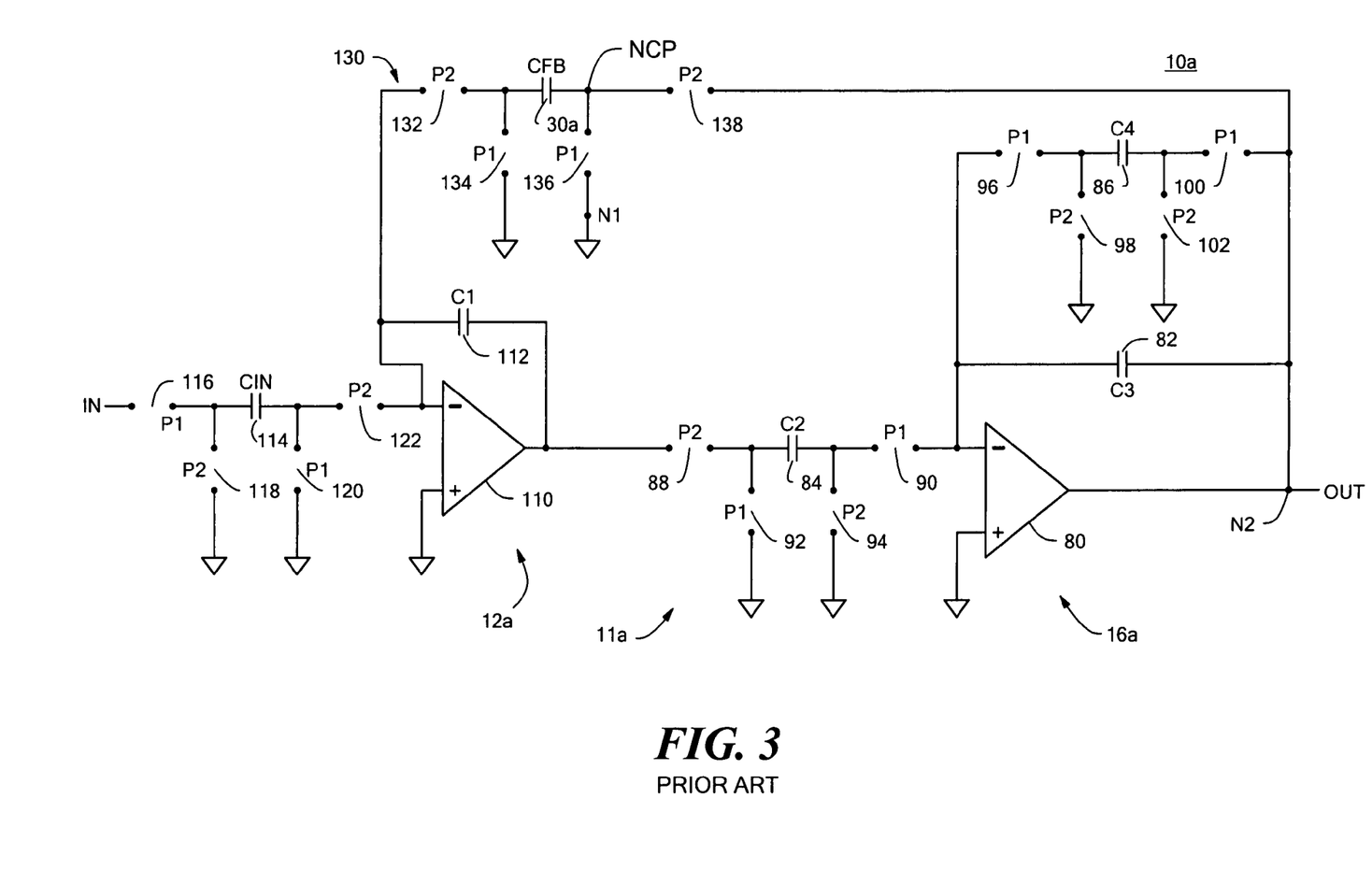
FIG. 3 is a schematic diagram of the prior art switched capacitor system of FIG. 1.

A standard low pass bi-quad switched capacitor filter system 10a which incorporates the equivalent circuit switched capacitor system 10 of FIG. 1 is shown in FIG. 3. In this and following figures like parts have been given like numbers and similar parts like numbers accompanied by lower case letters. There is shown an amplifier system 11a including two amplifier stages 12a and 16a and switched feedback capacitor 30a. Amplifier stage 16a includes amplifier 80, integrating capacitor 82 and input capacitor 84. There is a also a damping capacitor 86 which acts to control the lossiness of amplifier stage 16a by unloading charge from integrating capacitor 82 to prevent it from building up over a period of time. Also included in amplifier stage 16a are switches 88, 90, 92, and 94 which control the charge and discharge of input capacitor 84 as well as integrating capacitor 82 and switches 96, 98, 100, and 102 which control the charging and discharging of damping capacitor 86 and also effects the charge on integrating capacitor 82. Amplifier stage 12a includes amplifier 110 with integrating capacitor 112 and input capacitor 114. Switches 116, 118, 120, and 122 control the charging and discharging of input capacitance 114 and its effect on the charge on the integrating capacitor 112. Feedback capacitor 30a has associated with it a switching circuit 130 including switches 132, 134, 136, and 138 which control the charging and discharging of feedback capacitor 30a.

In operation, in phase P1, input capacitor 114 of stage 12a is charged to the input voltage while charge on input capacitor 84 of stage 16a is transferred to integrating capacitor 82 and feedback capacitor 30a has both of its sides charged to a common mode voltage which may be zero, ground or any other voltage. Damping capacitor 86 drains charge from integrating capacitor 82. In phase P2 terminals of capacitor 86 charges to common mode voltage and input capacitor 114 transfers charge to the integrating capacitor 112. Input capacitor 84 samples the previous amplifier stage 12a, that is, it charges up to the output of stage 12a and the feedback capacitor 30a is charged by amplifier 80.

This invention takes advantage of the fact that there often is a preexisting glitch insensitive node (pre-charge node) in the system which closely follows in voltage or can be designed to closely follow the glitch sensitive node. The switch control signal that normally would be used to switch a capacitor on to the glitch sensitive node, is broken up into two signals, for example, phase P2_S, a short, pre-charging phase and phase P2_L, a longer final, settling phase. Phase P2_S is a short pre-charging phase at the beginning of phase P2 during which the pre-charge node is used to charge up partly or fully the switched capacitor, which then in phase P2_L is connected to the glitch sensitive node for a final charging. The closer the pre-charging node is in voltage to the glitch sensitive node voltage and the more complete the pre-charging is, the less charge the glitch sensitive node has to source or sink and thus its output will be less disturbed. That is, there will be less glitch when the capacitor is connected onto that node.

Figure 4:
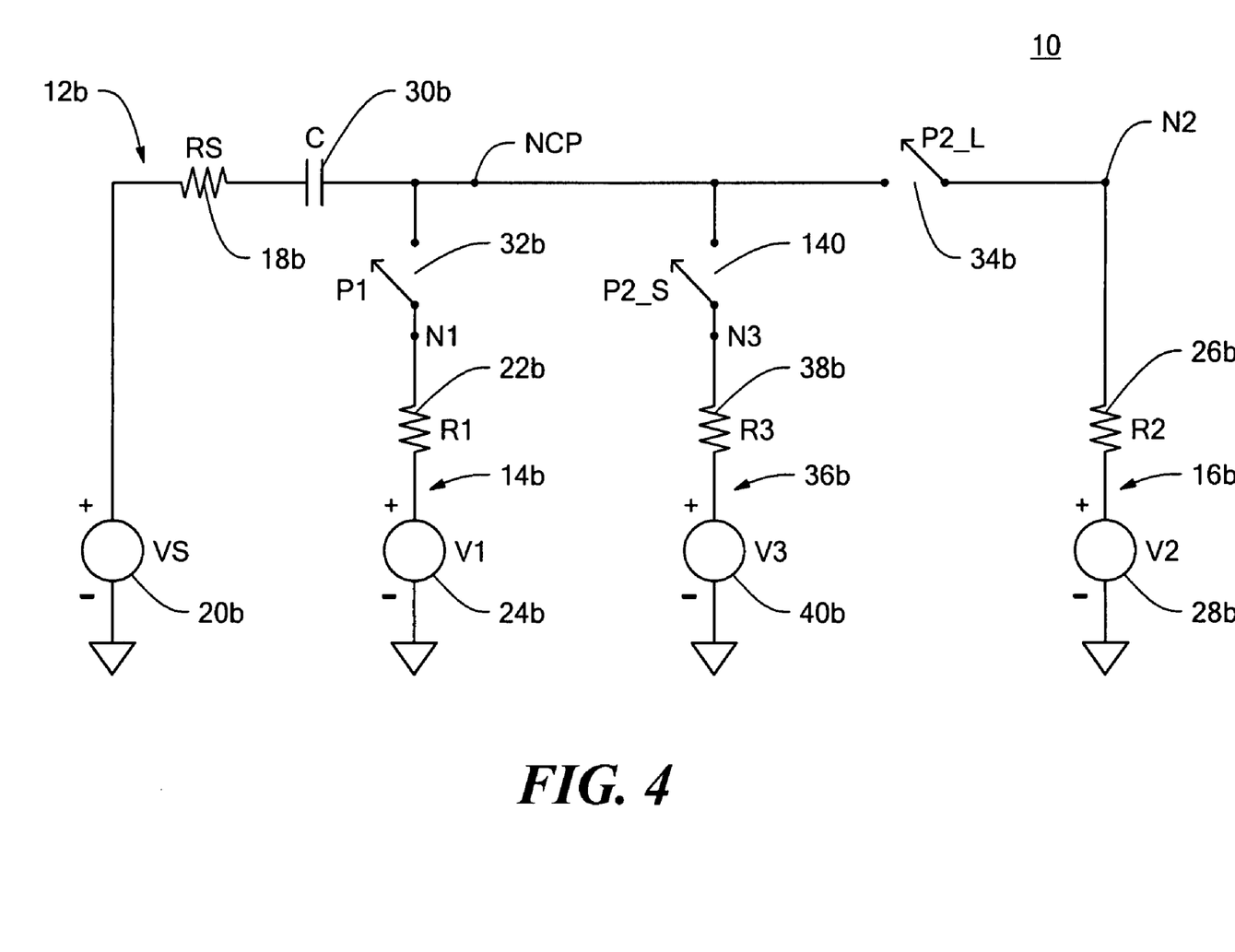
FIG. 4 is a schematic equivalent circuit of a switched capacitor system with output glitch reduction according to this invention.

An equivalent circuit of a switched capacitor system with output glitch reduction 10b is shown in equivalent form in FIG. 4, which is similar to that shown in FIG. 1 except that there are now three phases, phase P1, phase P2_S and phase P2_L. Switch 34b is now operated in phase P2_L rather than phase P2. A new switch 140 is operated in phase P2_S. In phase P1 142, FIG. 5, switch 32b is closed charging capacitor 30b to voltage V1 while switches 34b and 140 are open. In phase P2_S 144, FIG. 5, switches 32b and 34b are open, but switch 140 is closed. This is the pre-charge phase and it connects a pre-existing node N3 to node NCP which brings it part way up to voltage V2 of node N2. Since the voltage V3 on node N3 is generally much closer to V2 than to V1 is the voltage level of NCP has been charged toward the ultimate voltage level V2 on node N2. Thus, in the third phase, phase P2_L, 146, when switches 32b and 140 are open and switch 34b is closed, the voltage represented at node NCP only has to make the much smaller step from voltage V3 to voltage V2. Therefore, the glitch occurring at node N2 is much reduced.

Figure 5:
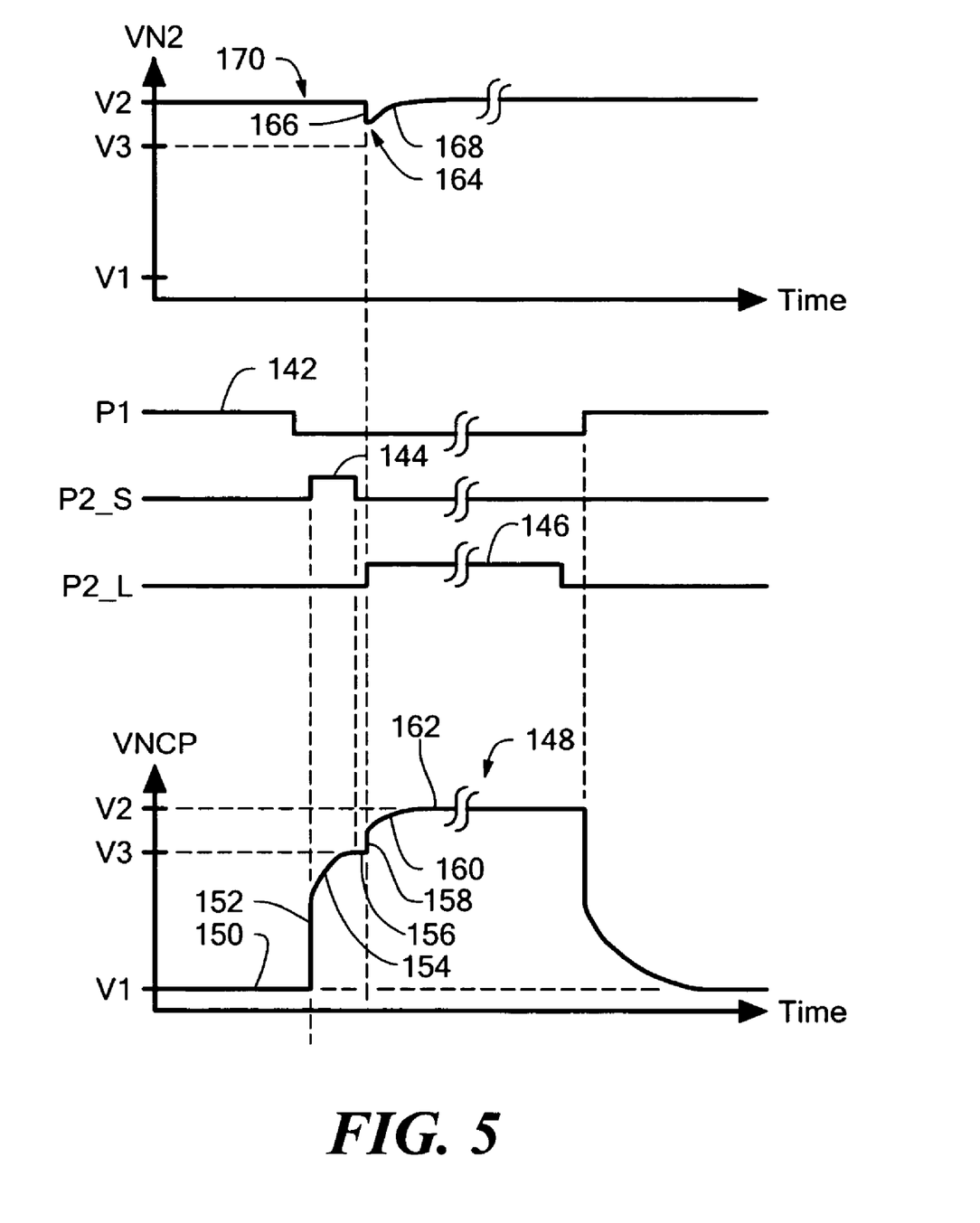
FIG. 5 shows waveforms occurring in the system of FIG. 4 illustrating the reduced output glitch achievable with this invention.

Referring further to FIG. 5, this can be seen with reference to the voltage VNCP 148 where during phase P1 voltage NCP is at level 150. Then at the beginning of the pre-charge phase 144, phase P2_S, it rises first abruptly 152, then more gradually 154, to voltage V3 at 156. During the settling phase, phase P2_L voltage VNCP rises again quickly at 158 and then more gradually at 160 until it reaches level V2 at 162. This results in a much smaller glitch 164 due to the much lower drop 166 and rise 168 of voltage VN2 170. In accordance with this invention, this glitch 164, typically has been reduced to tens of millivolts or less rather than hundreds of millivolts.

Figure 6:
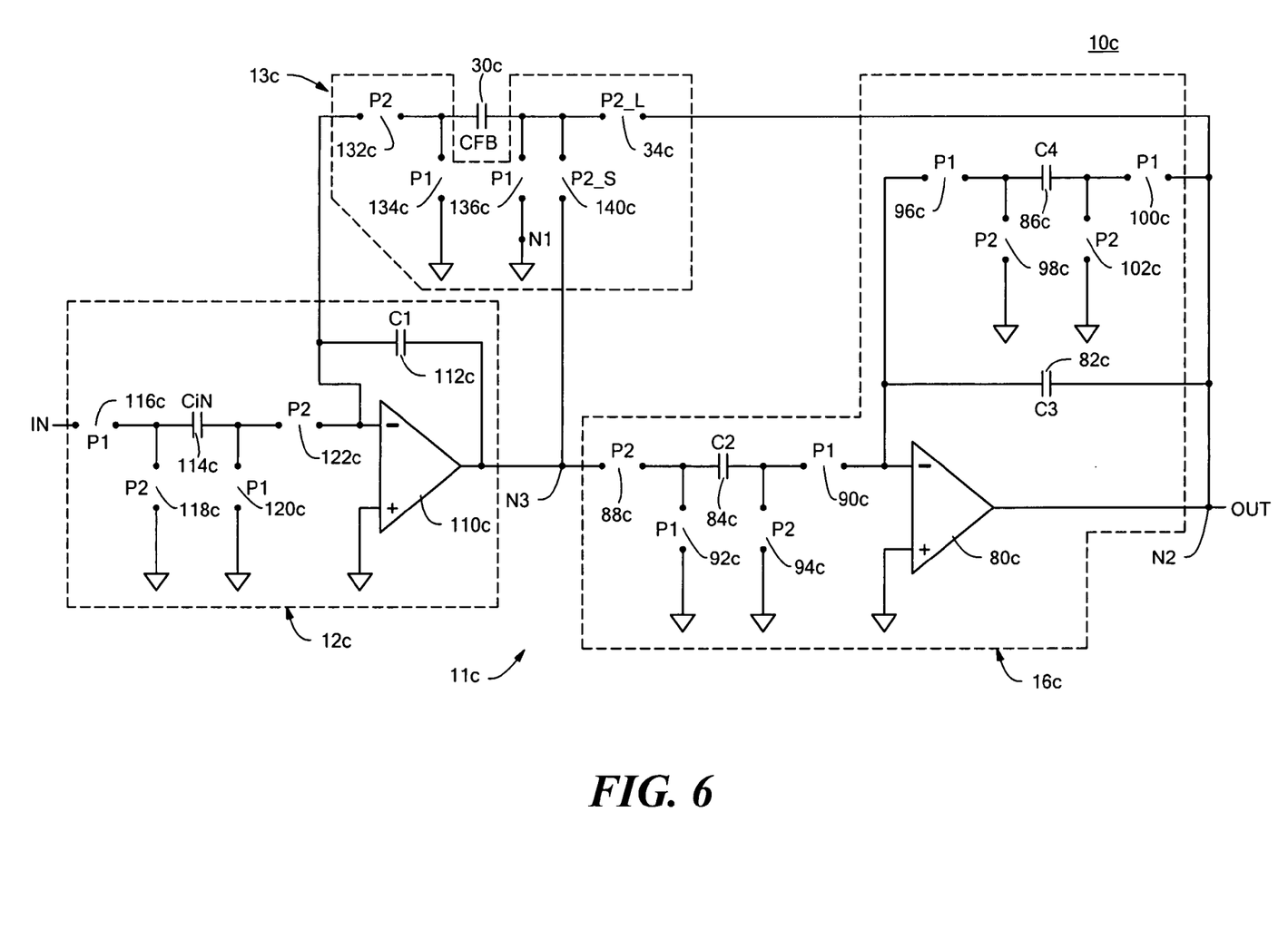
FIG. 6 is a schematic diagram of the switched capacitor system of FIG. 4.
Figure 7:
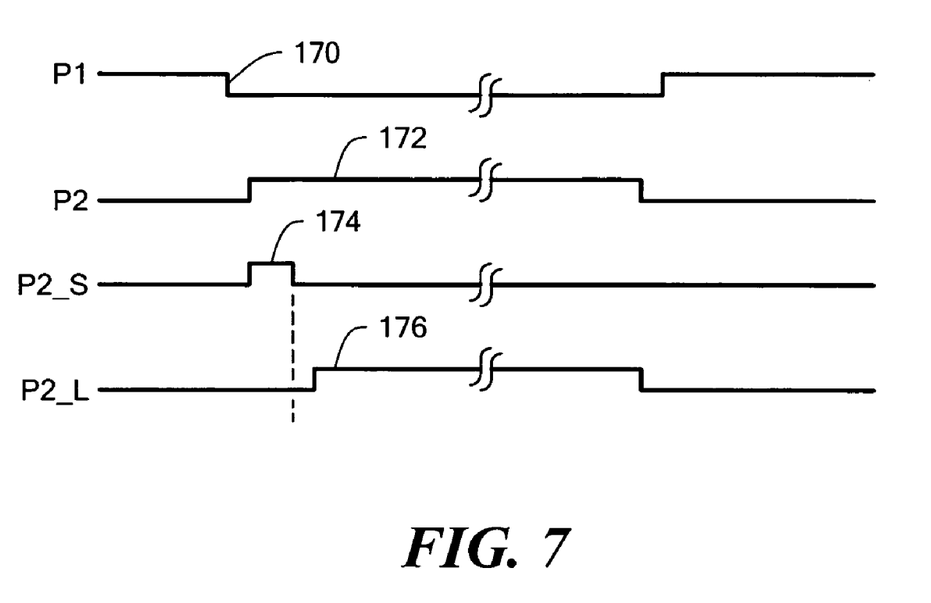
FIG. 7 shows the phase signals for the system of FIG. 6 according to this invention.

The switched capacitor system with output glitch reduction 10b, FIG. 4, according to this invention may be implemented as shown in FIG. 6, by switched capacitor system 10c which includes a multi-stage amplifier system 11c with amplifier stages 12c and 16c, switched feedback capacitor system 30c and switching circuit 13c. System 10c operates in accordance with system 10b where switch 140c is operated in the pre-charge phase P2_S and switch 34c is operated in the settling phase, phase P2_L. Here the node N3 that provides the pre-charge voltage is taken from the pre-existing node that can be the input of the very amplifier stage 16c whose output glitch at N2 is to be reduced. If amplifier system 11c is a multi-stage amplifier system as shown here, where there is a preceding amplifier stage 12c, then the preexisting node can be implemented with the output of the preceding amplifier stage. Preferably amplifier stage 16c whose output is to have its glitch reduced would be a unity gain stage, or close to it, so that the voltage on N3 would be quite close to the voltage on N2, thereby minimizing the glitch. The phase signals for operating system 10c are shown in FIG. 7 where phase P1 is shown at 170, phase P2 172, phase P2_S 174 and phase P2_L 176.

Figure 8:
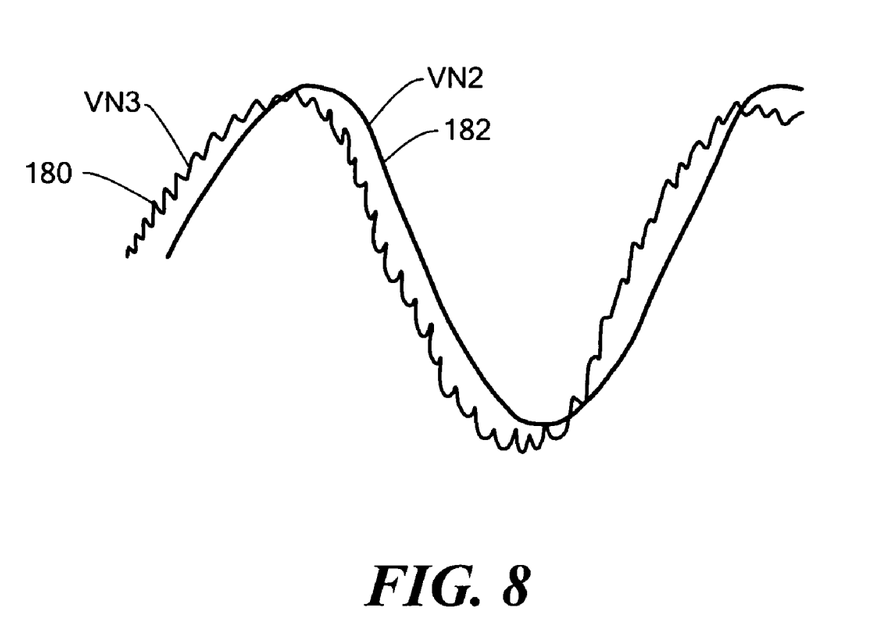
FIG. 8 shows the voltage waveforms at the output node and pre-charging node of FIG. 6.

An illustration of the voltage VN3 180, at node N3 being somewhat noisier, but quite close to voltage VN2 182 is shown in FIG. 8.

Figure 9:
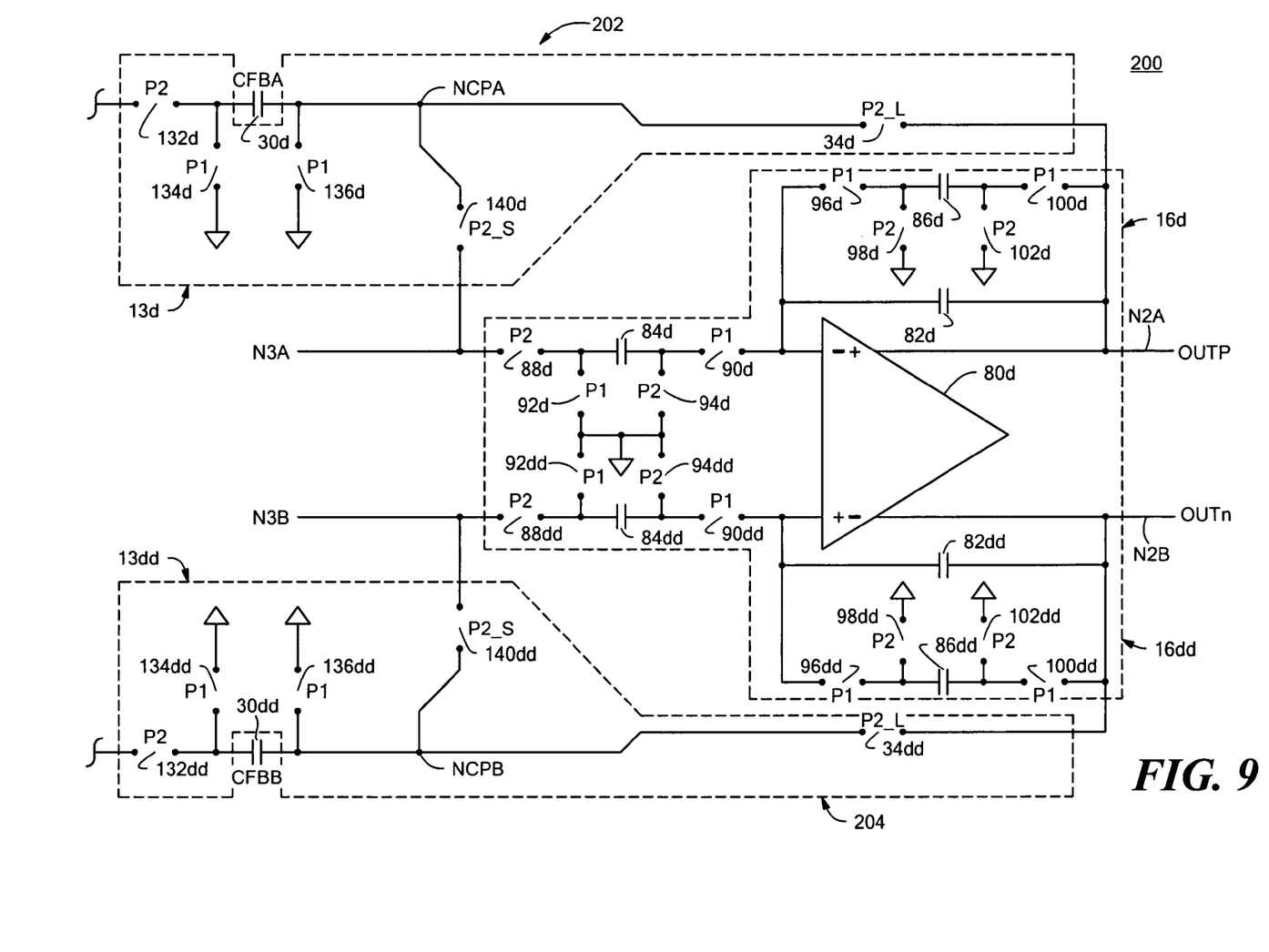
FIG. 9 is a schematic block diagram of a differential switched capacitor system with output glitch reduction according to this invention.

Although thus far the switched capacitor system with output glitch reduction has been shown as a single ended system it may as well be a differential system 200, FIG. 9 where amplifier 80d is a differential amplifier with dual inputs and outputs and dual mirrored stages 16d and 16dd each associated with a different channel 202, 204 wherein each channel includes a switching circuit 13d, 13dd and switched feedback capacitor 30d and 30dd, The operation of each half of the amplifier stage as well as switching circuits 13d and 13dd is the same as with respect to the single channel operation of FIG. 6.

Figure 10:
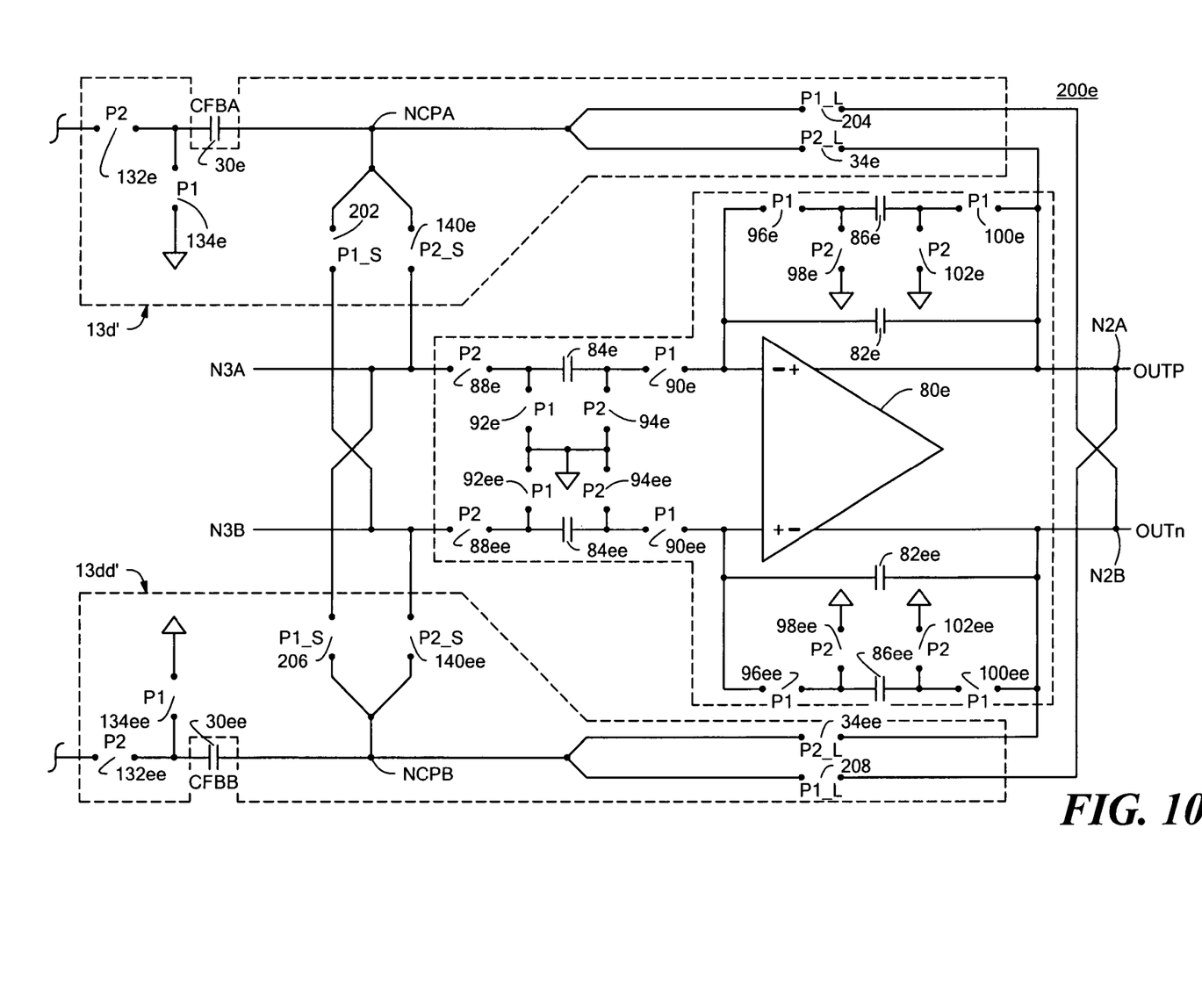
FIG. 10 is a schematic block diagram of a differential switched capacitor system with output glitch reduction according to this invention with cross-coupling.
Figure 11:
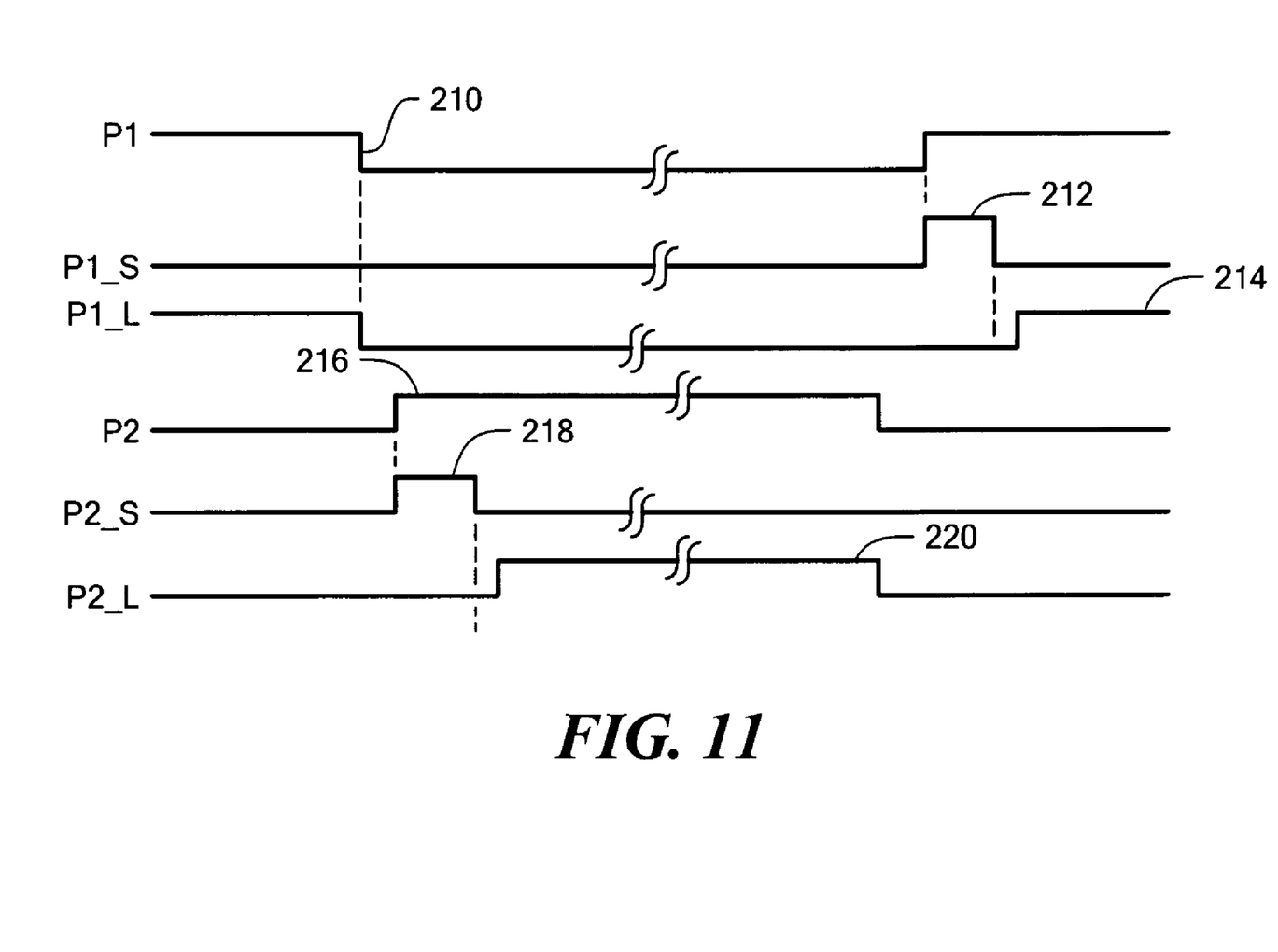
FIG. 11 shows the phase signals for the system of FIG. 10.

With a differential implementation cross-coupling can be effected as shown with respect to differential switch capacitor system 200e with output glitch reduction, FIG. 10, where switching circuit 13d' has added an additional switch 202 which is operated in the pre-charge phase P1_S and a switch 204 which is operated in the settling phase P1_L. Similarly in switching circuit 13dd', switch 206 operated in the pre-charge phase P1_S has been added along with switch 208 which is operated in the settling phase P1_L. These phase signals are shown in FIG. 11 as phase P1 210, phase P1_S 212, phase P1_L 214, phase P2 216, phase P2_S 218, and phase P2_L 220. In operation what this does is cross-couple the two channels so that switched feedback capacitors 30e, 30ee, FIG. 10, are charged not just to be the level of, for example, N2A minus common mode or N2B minus common mode, respectively, but to the full swing of the voltage difference between N2A and N2B. This effectively doubles the voltage applied to feedback capacitors 30e and 30ee. The advantage of this is that with twice the voltage available, the capacitor's size may be halved and yet still hold the same charge, thereby, reducing the area required for the capacitor on the circuit chip.

In all of the embodiments herein the capacitor may be configured as a switched capacitor wherein the amplifier and capacitor function as a low pass filter and the low pass filter may be the final filter stage for a digital to analog converter.

The method of output glitch reduction in a switched capacitor system including an amplifier stage having an input node and an output node and, a switched capacitor, may be carried out with the apparatus described herein or with any other suitable apparatus by charging the capacitor to a first voltage level in a first phase; charging the capacitor to the intermediate voltage level of the input node in a pre-charge phase; and charging the capacitor to a desired voltage level of the output node in a settling phase to reduce the output glitch of the amplifier stage. The amplifier stage used in the method may have a unity gain. There may be at least one preceding amplifier stage and the input node is at the output of the preceding stage. The capacitor may be a feedback capacitor.

The method of output glitch reduction is applicable to a switched capacitor system including an amplifier system with an amplifier stage having an output node, a capacitor, and a preexisting pre-charge node included in the amplifier system. The method may include charging the capacitor to a first voltage level in a first phase; charging the capacitor to the intermediate voltage level of the pre-charge node in the pre-charge phase; and charging the capacitor to a desired voltage level for the output node in a settling phase to reduce the output glitch of the amplifier stage. The amplifier system may be multi-stage and the pre-charge node may be at the output of a preceding amplifier stage. The capacitor may be a feedback capacitor.

The method is also applicable to a differential switched capacitor system including an amplifier stage having two input nodes and two output nodes, and first and second channels, each channel including a switched capacitor. The method includes charging the capacitor to a first voltage level in a first phase; charging the capacitor to the intermediate voltage level of the input node in a pre-charge phase; and charging the capacitor to a desired voltage level for the output node (typically the voltage level of the output node) in a settling phase to reduce the output glitch of the amplifier stage. The switching circuits may include cross-coupled switched circuits for cross-coupling the output nodes to the capacitors and cross-coupling the pre-charge nodes to the capacitors to increase the voltage across the capacitors. The method includes charging the switched capacitors to a first intermediate voltage level in a first pre-charge phase and then charging the switched capacitors to the voltage levels of the output nodes in a first setting phase to reduce the output glitch of the amplifier stage during phase 1, followed by charging the switched capacitors to a second intermediate voltage level in a second pre-charge phase and then charging the switched capacitors to the voltage level of the output mode in a second settling phase to reduce the output glitch of the amplifier stage during phase 2. The capacitors may be feedback capacitors.

The method is applicable as well to a differential switched capacitor system including an amplifier system with an amplifier stage having two output nodes, first and second channels, each channel including a switched capacitor and a preexisting pre-charge node included in the amplifier system. The method includes charging the switched capacitor to a first voltage level in a first phase; charging the switched capacitor to the intermediate voltage level of the pre-charge node in the a pre-charge phase; and charging the switched capacitor to the desired voltage level of the output node in a settling phase to reduce the output glitch of the amplifier stage.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A switched capacitor system with output glitch reduction comprising:
    an amplifier stage having an input node and an output node, the output node having an output voltage level and the input node having an intermediate voltage level;
    a switched capacitor; and
    a switching circuit for charging said switched capacitor to a first voltage level in a first phase, to the intermediate voltage level in a pre-charge phase, and to the output voltage level of the output node in a settling phase, thereby reducing an output glitch of said amplifier stage.

2. The switched capacitor system with output glitch reduction of claim 1 in which said amplifier stage has a unity gain.

3. The switched capacitor system with output glitch reduction of claim 1 in which there is at least one preceding amplifier stage and said input node is at the output of said preceding stage.

4. A switched capacitor system with output glitch reduction comprising:
    an amplifier system including an amplifier stage having an output node, the output node having an output voltage level;
    a switched capacitor;
    a preexisting pre-charge node included in said amplifier system, the pre-charge node having an intermediate voltage level; and
    a switching circuit for charging said switched capacitor to a first voltage level in a first phase, to the intermediate voltage level in the pre-charge phase and to the output voltage level in a settling phase, thereby reducing an output glitch of said amplifier stage.

5. The switched capacitor system with output glitch reduction of claim 4 in which said amplifier stage has a unity gain.

6. The switched capacitor system with output glitch reduction of claim 4 in which said pre-charge node is at the input of said amplifier stage.

7. The switched capacitor system with output glitch reduction of claim 4 in which said amplifier system is multi-stage and said pre-charge node is at the output of a preceding amplifier stage.

8. A differential switched capacitor system with output glitch reduction comprising:
    an amplifier stage having a differential input nodes and a differential output nodes, the differential output nodes having differential output voltage levels and the differential input nodes having differential intermediate voltage levels;
    first and second switched capacitors; and
    a switching circuit for charging said first and second switched capacitors to a first voltage level in a first phase, to the differential intermediate voltage levels in a pre-charge phase and to the differential output voltage levels in a settling phase, thereby reducing the output glitch of said amplifier stage.

9. The differential switched capacitor system with output glitch reduction of claim 8 in which said amplifier stage has a unity gain.

10. The differential switched capacitor system with output glitch reduction of claim 8 in which there is at least one preceding amplifier stage and said input node is at the output of said preceding stage.

11. A switched capacitor system with output glitch reduction of claim 8 in which said switching circuits include cross-coupled switched circuits for cross-coupling the output nodes to said switched capacitors and cross-coupling said pre-charge nodes to said switched capacitors to increase the voltage across said switched capacitors.

12. A differential switched capacitor system with output glitch reduction comprising:
    an amplifier system including an amplifier stage having differential output nodes, the differential output nodes having differential output voltage levels;
    first and second channels, each channel including:
        a switched capacitor;
        a preexisting pre-charge node included in said amplifier system, the pre-charge node having an intermediate voltage; and
        a switching circuit for charging said switched capacitor to a first voltage level in a first phase, to the intermediate voltage level in a pre-charge phase and to one channel of the differential output voltage level in a settling phase, thereby reducing the output glitch of said amplifier stage.

13. The switched capacitor system with output glitch reduction of claim 12 in which said amplifier stage has a unity gain.

14. The switched capacitor system with output glitch reduction of claim 12 in which said pre-charge node is at the input of said amplifier stage.

15. The switched capacitor system with output glitch reduction of claim 12 in which said amplifier system is multi-stage and said pre-charge node is at the output of a preceding amplifier stage.

16. A switched capacitor system with output glitch reduction of claim 12 in which said switching circuits include cross-coupled switched circuits for cross-coupling the output nodes to said switched capacitors and cross-coupling said pre-charge nodes to said switched capacitors to increase the voltage across said switched capacitors.

17. A method of output glitch reduction in a switched capacitor system including an amplifier stage having an input node and an output node and a switched capacitor, the method comprising:
    charging the switched capacitor to a first voltage level in a first phase;
    charging the switched capacitor to an intermediate voltage level of the input node in a pre-charge phase; and
    charging the switched capacitor to an output voltage level of the output node in a settling phase, thereby reducing the output glitch of the amplifier stage.

18. The method of output glitch reduction of claim 17 in which the amplifier stage has a unity gain.

19. The method of output glitch reduction of claim 17 in which there is at least one preceding amplifier stage and the input node is at the output of the preceding stage.

20. A method of output glitch reduction in a switched capacitor system including an amplifier system having an amplifier stage having an output node, a switched capacitor, and a preexisting pre-charge node included in the amplifier system, the method comprising:
    charging the switched capacitor to a first voltage level in a first phase;
    charging the switched capacitor to an intermediate voltage level of the pre-charge node in a pre-charge phase; and
    charging the switched capacitor to an output voltage level of the output node in a settling phase, thereby reducing the output glitch of the amplifier stage.

21. The method of output glitch reduction of claim 20 in which the amplifier stage has a unity gain.

22. The method of output glitch reduction of claim 20 in which the pre-charge node is at the input of the amplifier stage.

23. The method of output glitch reduction of claim 20 in which the amplifier system is multi-stage and the pre-charge node is at the output of a preceding amplifier stage.

24. A method of output glitch reduction in a differential switched capacitor system including an amplifier stage having differential input nodes and differential output nodes, the method comprising:
    charging first and second switched capacitors to a first voltage level in a first phase;

charging the first and second switched capacitors to differential intermediate voltage levels of the differential input nodes in a pre-charge phase; and charging the first and second switched capacitors to differential output voltage levels of the output node in a settling phase, thereby reducing the output glitch of the amplifier stage.

25. The method of output glitch reduction of claim 24 in which the amplifier stage has a unity gain.

26. The method of output glitch reduction of claim 24 in which there is at least one preceding amplifier stage and the input node is at the output of the preceding stage.

27. The method of output glitch reduction of claim 24 in which the switching circuits include cross-coupled switched circuits for cross-coupling the output nodes to the switched capacitors and cross-coupling the pre-charge nodes to the switched capacitors to increase the voltage across the switched capacitors.

28. A method of output glitch reduction in a differential switched capacitor system including an amplifier system having differential output nodes, first and second switched capacitors, and differential pre-charge nodes, the method comprising:

charging the first and second switched capacitors to a first voltage level in a first phase;

charging the first and second switched capacitors to differential intermediate voltage levels of the differential pre-charge nodes in a pre-charge phase; and charging the first and second switched capacitors to differential output voltage levels of the differential output nodes in a settling phase, thereby reducing the output glitch of the amplifier stage.

29. The method of output glitch reduction of claim 28 in which the amplifier stage has a unity gain.

30. The method of output glitch reduction of claim 28 in which the pre-charge node is at the input of the amplifier stage.

31. The method of output glitch reduction of claim 28 in which the amplifier system is multi-stage and the pre-charge node is at the output of a preceding amplifier stage.

32. A switched capacitor system with output glitch reduction of claim 28 in which the switching circuits include cross-coupled switched circuits for cross-coupling the output nodes to the switched capacitors and cross-coupling the pre-charge nodes to the switched capacitors to increase the voltage across the switched capacitors.

* * * * *